United States Patent
Li et al.

(10) Patent No.: US 6,892,368 B2
(45) Date of Patent: May 10, 2005

(54) PATCHING TECHNIQUE FOR CORRECTION OF MINIMUM AREA AND JOG DESIGN RULE VIOLATIONS

(75) Inventors: Mu-Jing Li, Sunnyvale, CA (US); Amy Yang, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 226 days.

(21) Appl. No.: 10/374,948

(22) Filed: Feb. 26, 2003

(65) Prior Publication Data

US 2003/0229862 A1 Dec. 11, 2003

Related U.S. Application Data

(63) Continuation-in-part of application No. 10/166,210, filed on Jun. 10, 2002, now Pat. No. 6,775,806.

(51) Int. Cl.$^7$ .............................................. G06F 17/50
(52) U.S. Cl. ............................................... 716/5; 716/4
(58) Field of Search ........................................ 716/4–5

(56) References Cited

U.S. PATENT DOCUMENTS

| | | |
|---|---|---|
| 5,620,916 A | 4/1997 | Eden et al. |
| 5,689,435 A | 11/1997 | Umney et al. |

(Continued)

OTHER PUBLICATIONS

Yu Chen et al., "Hierarchical Dummy Fill for Process Uniformity," Proc. Asia and South Pacific Design Automation Conf, Jan. 2001, pp. 139–144.

Andrew B. Kahng et al., "Filling Algorithms and Analyses for Layout Density Control," IEEE Trans. Computer Aided Design 18(4) (1999) pp. 445–462.

Barnes, "Skill: A CAD System Extension Language," 1990 27$^{th}$ ACM/EEE Design Automation Conference, pp. 266–271.

Karam et al., "High Level CAD Melds Microsystems with Foundries," 1996 European Design and Test Conference, pp. 442–447.

Luo et al., "An Edge–Endpoint–Based Configurable Hardware Architecture for VLSI CAD Layout Design Rule Checking," 1999 7$^{th}$ Annual IEEE Symposium on Field–Programmable Custom Computing Machines, pp. 158–167.

Diva Verification, http://www.cadence.com/datasheets/diva.html 2002 Cadence Design Systems, Inc., downloaded May 17, 2002, 3 pages.

Primary Examiner—Stacy A. Whitmore
(74) Attorney, Agent, or Firm—Zagorin O'Brien Graham LLP

(57) ABSTRACT

Automated patching techniques to correct certain rule violations are used, simplifying and automating the design layout of an electronic circuit, whether embodied as a design encoding or as a fabricated electronic circuit. A series of patches of predefined orientations are utilized to correct design rule violations. A set of violations are identified, patches of a predefined orientation are attempted to correct one or more violations. Patches of another predefined orientation are attempted to correct remaining violations. Attempted patching is repeated until all patches in the series have been attempted or all violations have been corrected. Patches can be added to a construction layer over the set of violations, and each patch that does not cause a design rule violation can be copied to a metal layer. A series of patches of predefined orientations are used, efficiently correcting design rule violations such as minimum area and jog rule violations.

53 Claims, 12 Drawing Sheets

U.S. PATENT DOCUMENTS

| | | | |
|---|---|---|---|
| 5,706,295 A | 1/1998 | Suzuki | |
| 5,798,937 A | 8/1998 | Bracha et al. | |
| 5,926,723 A | 7/1999 | Wang | |
| 5,970,238 A | 10/1999 | Shibata et al. | |
| 6,011,911 A | 1/2000 | Ho et al. | |
| 6,026,224 A | 2/2000 | Darden et al. | |
| 6,063,132 A | 5/2000 | DeCamp et al. | |
| 6,078,737 A | 6/2000 | Suzuki | |
| 6,189,136 B1 | 2/2001 | Bothra | |
| 6,209,123 B1 | 3/2001 | Maziasz et al. | |
| 6,275,971 B1 | 8/2001 | Levy et al. | |
| 6,301,686 B1 | 10/2001 | Kikuchi et al. | |
| 6,324,673 B1 | 11/2001 | Luo et al. | |
| 6,370,679 B1 | 4/2002 | Chang et al. | |
| 6,374,395 B1 | 4/2002 | Wang | |
| 6,378,110 B1 | 4/2002 | Ho | |
| 6,446,873 B1 | 9/2002 | Geryk | |
| 6,457,163 B1 | 9/2002 | Yang | |
| 6,461,877 B1 | 10/2002 | Holloway et al. | |
| 6,484,302 B1 | 11/2002 | Freymuth | |
| 6,487,706 B1 | 11/2002 | Barkley et al. | |
| 6,536,023 B1 | 3/2003 | Mohan et al. | |
| 6,606,735 B1 | 8/2003 | Richardson et al. | |
| 6,611,946 B1 | 8/2003 | Richardson et al. | |
| 6,615,400 B1 | 9/2003 | Lukanc | |
| 6,637,013 B1 | 10/2003 | Li | |
| 6,718,527 B2 | 4/2004 | Li | |
| 6,775,806 B2 * | 8/2004 | Li | 716/1 |
| 2002/0127479 A1 | 9/2002 | Pierrat | |
| 2002/0174413 A1 | 11/2002 | Tanaka | |
| 2003/0061583 A1 | 3/2003 | Malhotra | |
| 2003/0088843 A1 | 5/2003 | Mehrotra et al. | |
| 2003/0182644 A1 | 9/2003 | Li et al. | |
| 2003/0196180 A1 | 10/2003 | Li et al. | |
| 2003/0229860 A1 | 12/2003 | Li | |
| 2003/0229862 A1 | 12/2003 | Li et al. | |
| 2004/0019862 A1 | 1/2004 | Li et al. | |
| 2004/0019866 A1 | 1/2004 | Li | |
| 2004/0019867 A1 | 1/2004 | Li | |
| 2004/0019868 A1 | 1/2004 | Li | |
| 2004/0025125 A1 | 2/2004 | Li | |
| 2004/0063228 A1 | 4/2004 | Li et al. | |
| 2004/0064795 A1 | 4/2004 | Li et al. | |
| 2004/0064796 A1 | 4/2004 | Li | |
| 2004/0064797 A1 | 4/2004 | Li | |

* cited by examiner

VERTICAL CENTER PATCH

BOTTOM PATCH

TOP PATCH

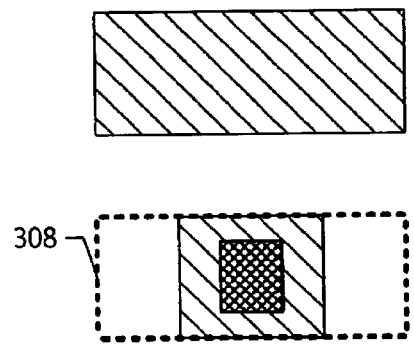
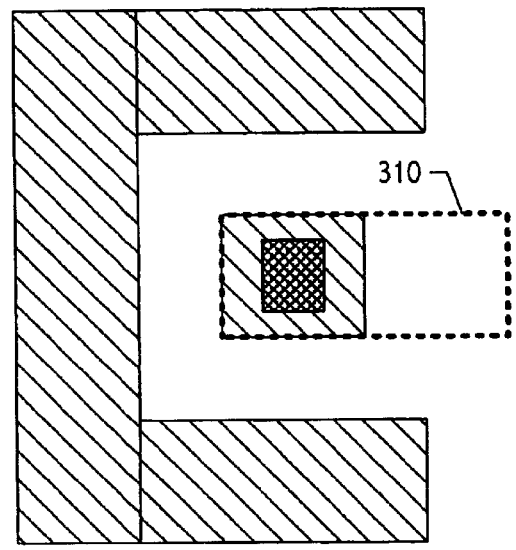
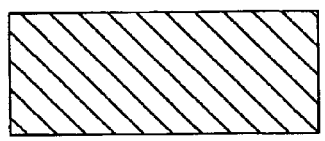
HORIZONTAL CENTER PATCH
FIG. 3D
RIGHT PATCH
FIG. 3E
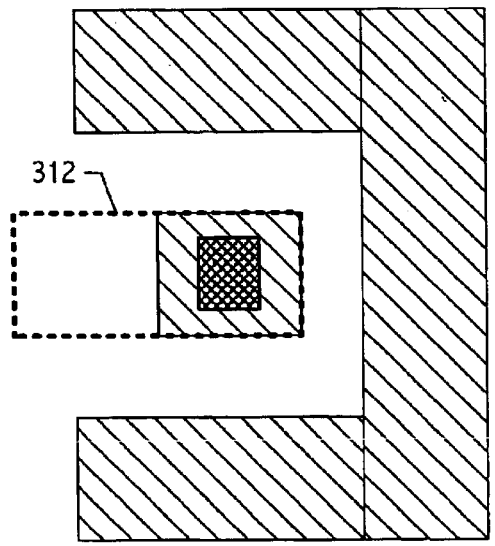
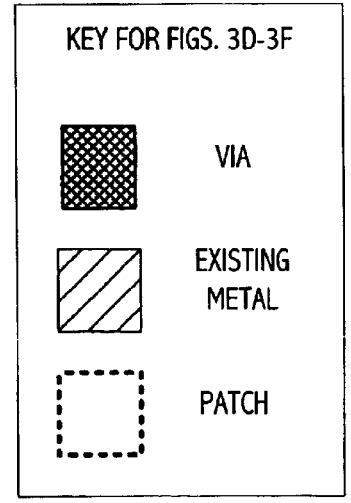
LEFT PATCH
FIG. 3F

CONCAVE JOG
RULE VIOLATION

CONVEX JOG
RULE VIOLATION

CONVEX ABUTTING CONCAVE
JOG RULE VIOLATION

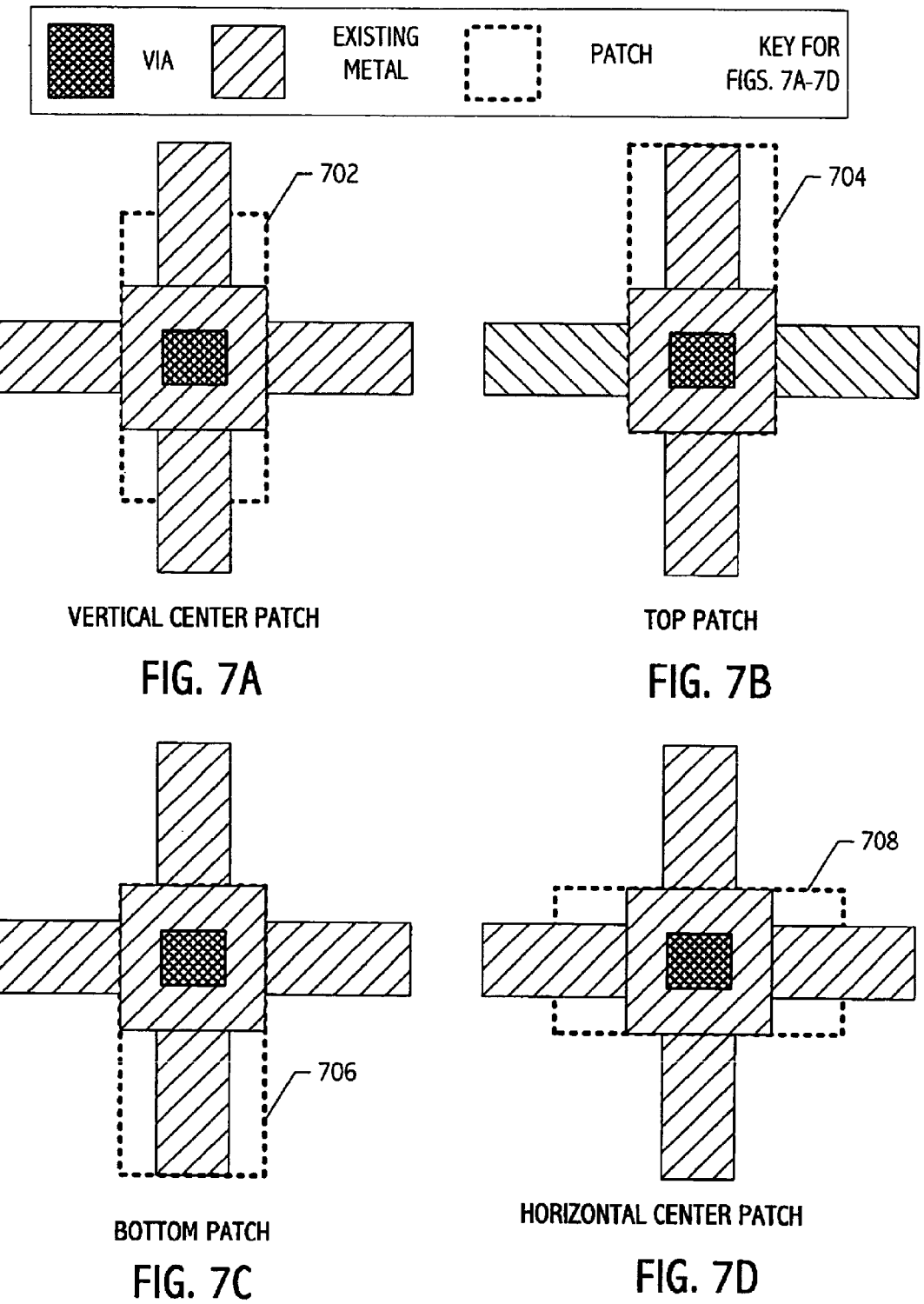

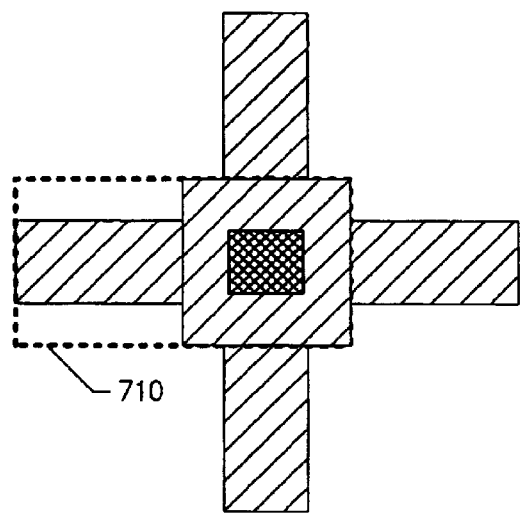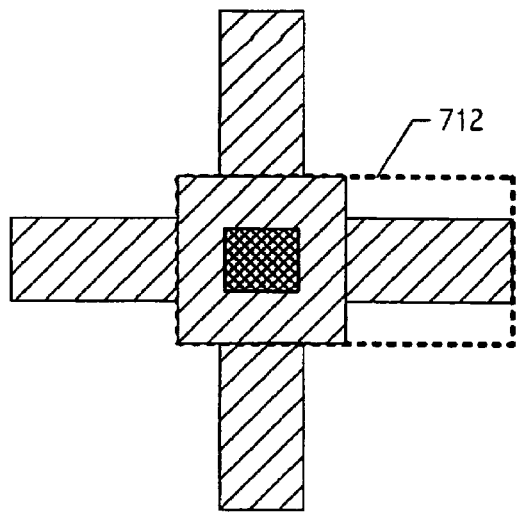
LEFT PATCH
FIG. 7E
RIGHT PATCH
FIG. 7F
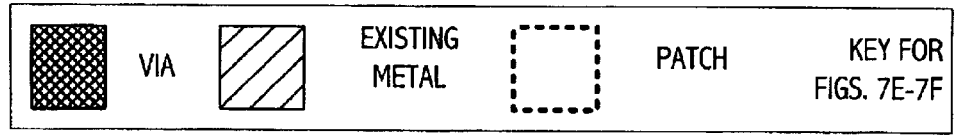

CONCAVE PATCH

CONVEX PATCH

PATCHING TECHNIQUE FOR CORRECTION OF MINIMUM AREA AND JOG DESIGN RULE VIOLATIONS

CROSS-REFERENCE TO RELATED APPLICATION(S)

This application is a Continuation-in-Part Application of U.S. application Ser. No. 10/166,210 filed on Jun. 10, 2002 now U.S. Pat. No. 6,775,806, entitled "Method, System and Computer Product to Produce a Computer-Generated Integrated Circuit Design" by Mu-Jing Li, which application is hereby incorporated by reference in its entirety.

BACKGROUND

1. Field of the Invention

This invention relates to the layout of electronic circuits and more particularly to complex computer aided design layout and correction of rule violations in a design layout of, for example, an integrated circuit (IC) device or printed wiring board, in preparation for fabrication.

2. Description of the Related Art

Design of an electronic circuit, for example, an integrated circuit (IC), is a complicated and time consuming process. FIG. 1 illustrates a typical design flow 100 of an integrated circuit device from conception through the generation of a fabrication ready design layout. Generally, design flow 100 commences with defining the design specifications or requirements, such as required functionality and timing, step 102. The requirements of the design are implemented, for example, as a net-list or electronic circuit description, step 104. The implementation can be performed by, for example, schematic capture (drawing the design with a computer aided design tool) or more typically, utilizing a high level description language such as VHDL, Verilog and the like. The implemented design is simulated to verify design accuracy, step 106. Design implementation and simulation are iterative processes. For example, errors found by simulation are corrected by design implementation and re-simulated.

Once the design is verified for accuracy with simulation, a design layout of the design is created, step 108. The design layout describes the detailed design geometries and the relative positioning of each design layer to be used in actual fabrication. The design layout is very tightly linked to overall circuit performance (area, speed and power dissipation) because the physical structure defined by the design layout determines, for example, the transconductances of the transistors, the parasitic capacitances and resistances, and the silicon area which is used to realize a certain function. The detailed design layout requires a very intensive and time-consuming design effort and is typically performed utilizing specialized computer aided design (CAD) or Electronic Design Automation (EDA) tools.

The design layout is checked against a set of design rules in a design rule check (DRC), step 110. The created design layout must conform to a complex set of design rules in order, for example, to ensure a lower probability of fabrication defects. The design rules specify, for example, how far apart various layers must be, or how large or small various aspects of the layout must be for successful fabrication, given the tolerances and other limitations of the fabrication process. A design rule can be, for example, a minimum spacing amount between geometries and is typically closely associated to the technology, fabrication process and design characteristics. For example, different minimum spacing amounts between geometries can be specified for different sizes of geometries. DRC is a time-consuming iterative process that often requires manual manipulation and interaction by the designer. The designer performs design layout and DRC iteratively, reshaping and moving design geometries to correct all layout errors and achieve a DRC clean (violation free) design.

Circuit extraction is performed after the design layout is completed and error free, step 112. The extracted circuit identifies individual transistors and interconnections, for example, on various layers, as well as the parasitic resistances and capacitances present between the layers. A layout versus schematic check (LVS) is performed, step 114, where the extracted net-list is compared to the design implementation created in step 104. LVS ensures that the design layout is a correct realization of the intended circuit topology. Any errors such as unintended connections between transistors, or missing connections/devices, etc. must be corrected in the design layout before proceeding to post-layout simulation, step 116. The post-layout simulation is performed using the extracted net-list which provides a clear assessment of the circuit speed, the influence of circuit parasitics (such as parasitic capacitances and resistances), and any glitches that can occur due to signal delay mismatches. Once post-layout simulation is complete and all errors found by DRC are corrected, the design is ready for fabrication and is sent to a fabrication facility.

As electronic circuit densities increase and technology advances, for example, in deep sub-micron circuits, skilled designers attempt to maximize the utilization of the design layout and the manufacturability and reliability of the circuit. Deep sub-micron designs typically have stringent design rules that are often not recognized by EDA tools, for example, automated place and route tools. Therefore, when creating a design layout in step 108, for example, many design rule violations can be created that must be corrected.

Because EDA tools are increasingly relied upon to create design layouts, and because EDA tools do not prevent the creation of certain violations, thousands of violations can be created that must be corrected. Performing a DRC and manipulation of the design layout to correct these violations often requires manual interaction from the designer. Creation of a violation-free design layout becomes a critical time consuming process. Due to the complexity of the design and because the place and route design flow can be repeated throughout the design process, manually fixing violations is not an affordable approach. Therefore, a DRC correction CAD flow is needed to fix the design rule violations.

SUMMARY

Accordingly, an automated technique to correct large amounts of design rule violations that simplifies and improves the efficiency of automated design layout of an electronic circuit, whether embodied as a design encoding or as a fabricated electronic circuit is presented. In particular, violations, such as minimum area and jog rule violations, are corrected utilizing predefined patch orientations to determine optimum locations for the placement of patches to correct the design rule violations. A minimum area rule violation occurs, for example, when the size of a geometry is smaller than a predefined limit. A jog rule violation occurs when two consecutive edges are each less than a predefined length, referred to as the JogLength. Minimum area and jog rule violations can cause an integrated circuit to have process related failures. The locations with rule violations are patched to correct the violations. By predefining a series of patch orientations and the order in which the patches are attempted, optimum correction of the rule violations is achieved.

In some embodiments, a set of violations on a metal layer in a design layout is identified, patches of a predefined orientation are added to a construction layer over the set of violations, each patch that does not cause a design rule violation is copied from the construction layer to the metal layer, and all patches are removed from the construction layer. The adding, the copying and the removing is repeated to remaining violations in the set of violations using patches of another predefined orientation. A series of patches of predefined orientations can be used, efficiently correcting design rule violations such as minimum area and jog rule violations.

In some embodiments, adding the patches includes determining if an added patch overlaps or causes a spacing violation with a previously added patch, if so and the previously added patch has a marking indicating modified placement, removing the added patch; and if so and the previously added patch does not have the marking, moving the added patch and the previously added patch in opposite directions and adding the marking to each of the added patch and the previously added patch.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIGS. 3A–3F illustrate a series of exemplary predefined patch orientations for minimum area violation correction according to an embodiment of the present invention.

FIGS. 7A–7F illustrate a series of exemplary predefined patch orientations for jog rule violation correction according to an embodiment of the present invention.

The use of the same reference symbols in different drawings indicates similar or identical items.

DESCRIPTION OF THE PREFERRED EMBODIMENT(S)

Figure 1:
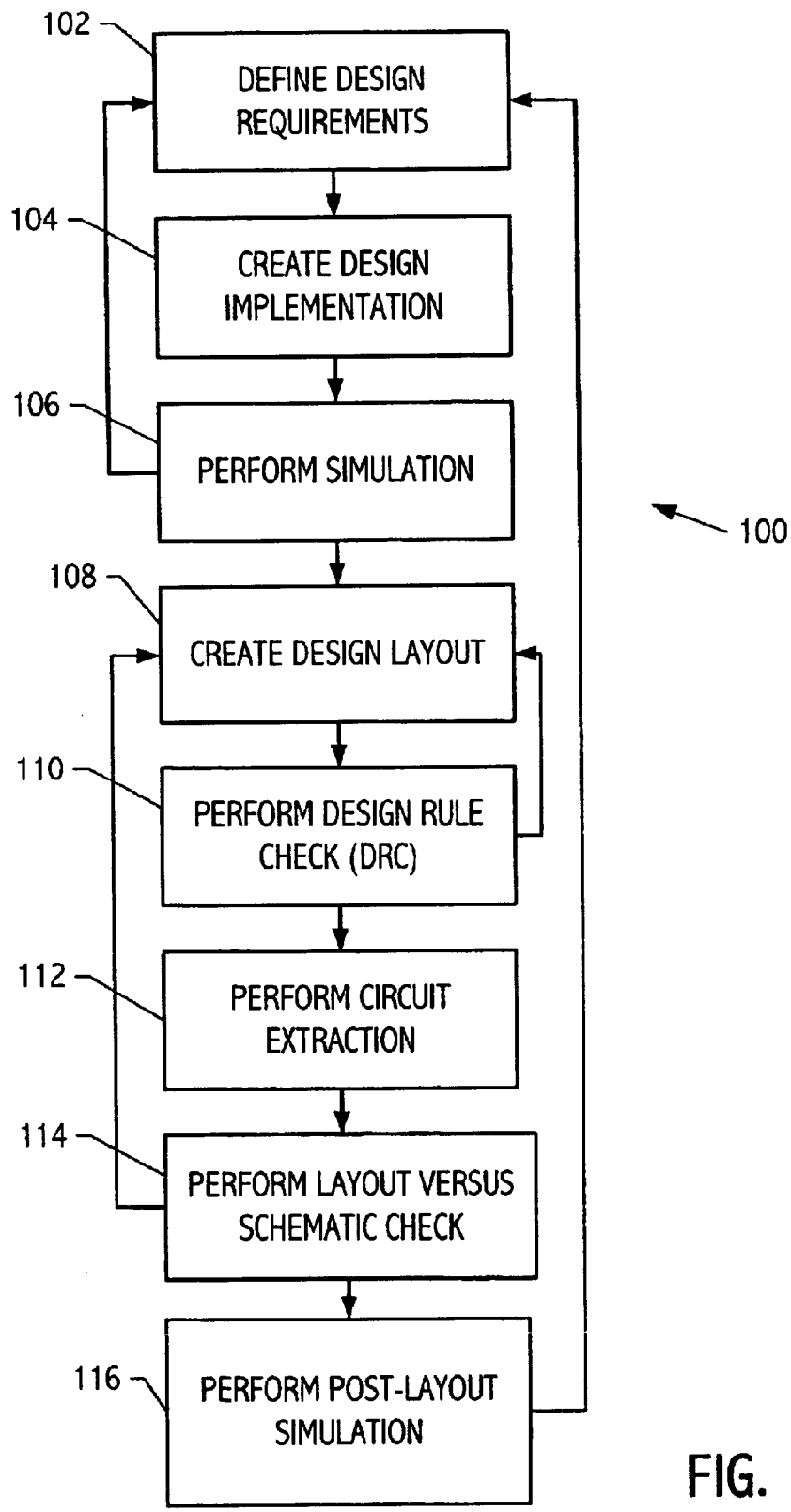
FIG. 1, prior art, illustrates an exemplary design flow 100 for an integrated circuit device.

Thousands of minimum area violations can be created during routing when creating a design layout. A minimum area violation, in which a given geometry is smaller than a predefined limit, can cause an integrated circuit to have process related failures. One common source of minimum area violations are vias and contacts. During design layout, a place and route tool is used to place lower level cells into an upper level cell and connect or route the cells together. During the routing process, when a wire on a specific layer needs to be connected to a wire on another layer, vias are used to connect the layers. Stacked vias are widely used to connect a lower level metal layer to any upper metal layer. For example, to connect metal layer 1 to metal layer 3, a first via, referred to as a lower via or via1, is used to connect metal layer 1 to metal layer 2 and a second via, referred to as an upper via or via2, is used to connect metal layer 2 to metal layer 3. Stacked vias can cause a minimum metal area violation on an intermediate metal layer because in advanced deep sub-micron design processes the metal area is smaller than the minimum metal area design rule, even though the metal width used to form via cells is typically greater than the minimum width of the wire. Contacts are used to connect metal layer 1 to polysilicon and can have similar minimum area violations.

Vias and contacts are also common sources of jog rule violations. A jog rule violation occurs when two consecutive edges are both smaller than a predefined length, referred to as a JogLength. Convex jog rule violations typically occur in groups of up to four around vias and contacts.

To fix a minimum area violation, a piece of square metal or patch which meets the minimum metal area design rule can be placed over the minimum area violation. Alternatively, a larger metal piece can be added and cut down to meet the design rules. These techniques can also be used to correct jog rule violations. However, unless carefully and often manually performed, both of these fixes can cause additional design rule violations, for example, a minimum spacing rule violation or another jog rule violation.

According to the present invention, automated design flows utilize predefined patch orientations to determine optimum locations for the placement of patches to correct design rule violations.

When adding patches for correction of minimum area violations, a series of predefined orientations for patches are utilized to avoid creating minimum spacing rule violations between a patch and existing metal. In some embodiments, patches of a first predefined orientation are placed on a construction layer over minimum area violations on a metal layer. When placing each patch, if the new patch overlaps or causes a minimum spacing violation with a previously placed patch, both patches are moved, for example, in the opposite direction, and marked to indicate modified positioning. However, if the previously placed patch already has such marking, the new patch is not placed and the previously placed patch is not moved. Next, design rules, for example, minimum spacing rules, are checked between the existing metal and the placed patches. If a placed patch is not violating a design rule, the placed patch is copied to the metal layer. Next, all patches are removed from the construction layer. If minimum area violations remain, patches of the next predefined orientation can be placed on the construction layer over the remaining minimum area violations. This process can be repeated until all minimum area violations are corrected or all predefined orientations have been attempted. This flow can be repeated for every metal layer, as needed.

When adding patches for correction of jog rule violations, a similar flow to the minimum area violation correction flow can be utilized. However, first any concave jog rule violations are identified and individual patching is attempted. Next, a set of convex violations related to a contact or via type are identified. Convex violations related to contacts and different vias types are divided into sets of violations that are patched differently based on the characteristics of each violation. For example, convex jog rule violations related to contacts can be corrected first using smaller patch sizes than patches used to correct convex jog rule violations related to vias. Lower and upper vias corresponding to a specific metal layer can also be in different sets and corrected separately. Up to four convex jog rule violations can be related to a single via or contact and can typically be corrected using a single patch. A series of predefined orientations for the patches to correct the violations in the set are utilized to avoid creating minimum spacing rule violations between a patch and existing metal. Patches of a first predefined orientation are placed on a construction layer over each violation in the set. When placing each patch, if a new patch overlaps or causes a minimum spacing violation with a previously placed patch, both patches are moved, for example, in the opposite direction, and marked to indicate modified positioning. However, if the previously placed patch already has such marking, the new patch is not placed and the previously placed patch is not moved. The patching utilizing the series of predefined orientations is repeated for each set on the metal layer. After all predefined patching orientations have been attempted, any remaining concave and convex jog rule violations are identified and individual patching is attempted. By treating convex jog rule violations in different sets, a more efficient design flow is achieved utilizing minimum patch sizes. Additionally, concave jog rule violations are preferably patched first because correcting a concave jog rule violation can correct an abutting convex jog rule violation. This flow can be repeated for every metal layer, as needed.

Minimum Area Violation Correction Patching

To correct minimum area violations with metal patches, an automated flow attempts to place patches according to a series of predefined orientations over the minimum area violations. The predefined orientations can follow, for example, the routing direction of the metal layer. Additionally, the width and length of the patches are defined based on the characteristics of the associated metal layer.

Figure 2A:
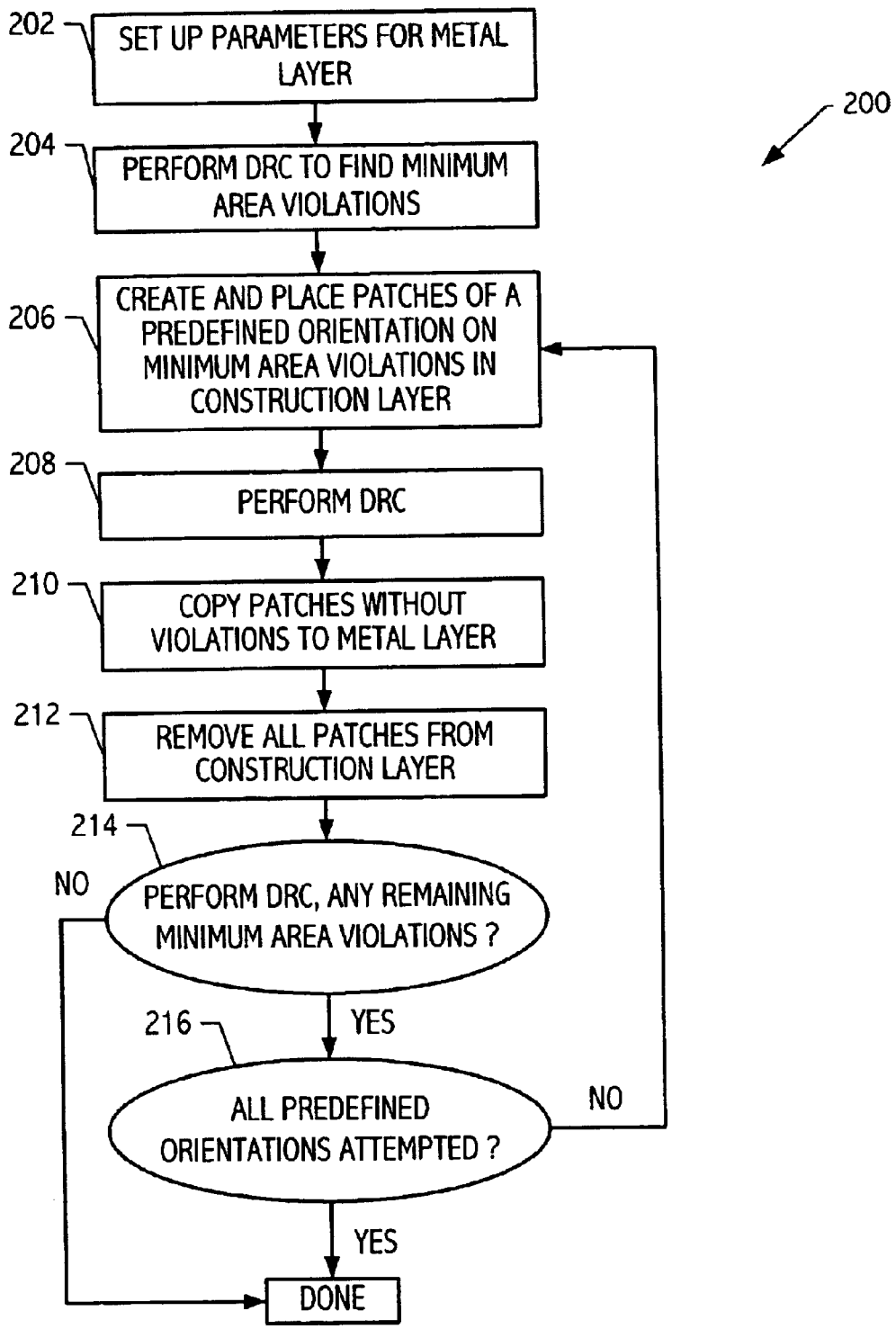
FIGS. 2A–2B illustrate exemplary automated flows for minimum area violation correction patching according to an embodiment of the present invention.

FIG. 2A illustrates an exemplary automated flow for minimum area violation correction patching according to an embodiment of the present invention. Flow 200 can be implemented in SKILL® programming language or other programming language understood by CAD tools for the manipulation of design layouts. SKILL is a high level coding language that allows the manipulation of individual objects on a metal layer. SKILL invokes DIVA® to perform rule checking for one or more metal layers. The DIVA physical layout verification tool is a well known tool for manipulating design layers and performing design rule checking of a design layout. DIVA and SKILL are registered trademarks of and are available from CADENCE DESIGN SYSTEMS, INC. of San Jose, Calif.

Parameters for a given metal layer are configured and initialized, step 202. For example, a SKILL program can open the design cell view, identify a metal layer to be processed, and set the default routing directions (horizontal or vertical). Also, predefined patch options for each routing direction can be configured. FIGS. 3A–3F illustrate a series of exemplary predefined patch orientations for minimum area violation correction according to an embodiment of the present invention. Note that both the metal layer with, for example, existing metal geometries, wires, and vias, and a construction layer with patches are illustrated. FIGS. 3A–3F illustrate, respectively, a center patch for vertical routing 302 (center_v), a bottom patch 304 (bottom), a top patch 306 (top), a center patch for horizontal routing 308 (center_h), a right patch 310 (right), and a left patch 312 (left). Exemplary predefined orientations for horizontal routing indicating the order in which patch orientations are attempted are center_h, left, right, center_v, top, bottom. Exemplary predefined orientations for vertical routing are center_v, top, bottom, center_h, left, right. Orientations for patch placement are typically attempted in this order because extra area is often available in the routing direction. Typically, a large portion of violations can be corrected with the first predefined patch orientation, for example, center_h for a metal layer with horizontal routing.

Figure 2B:
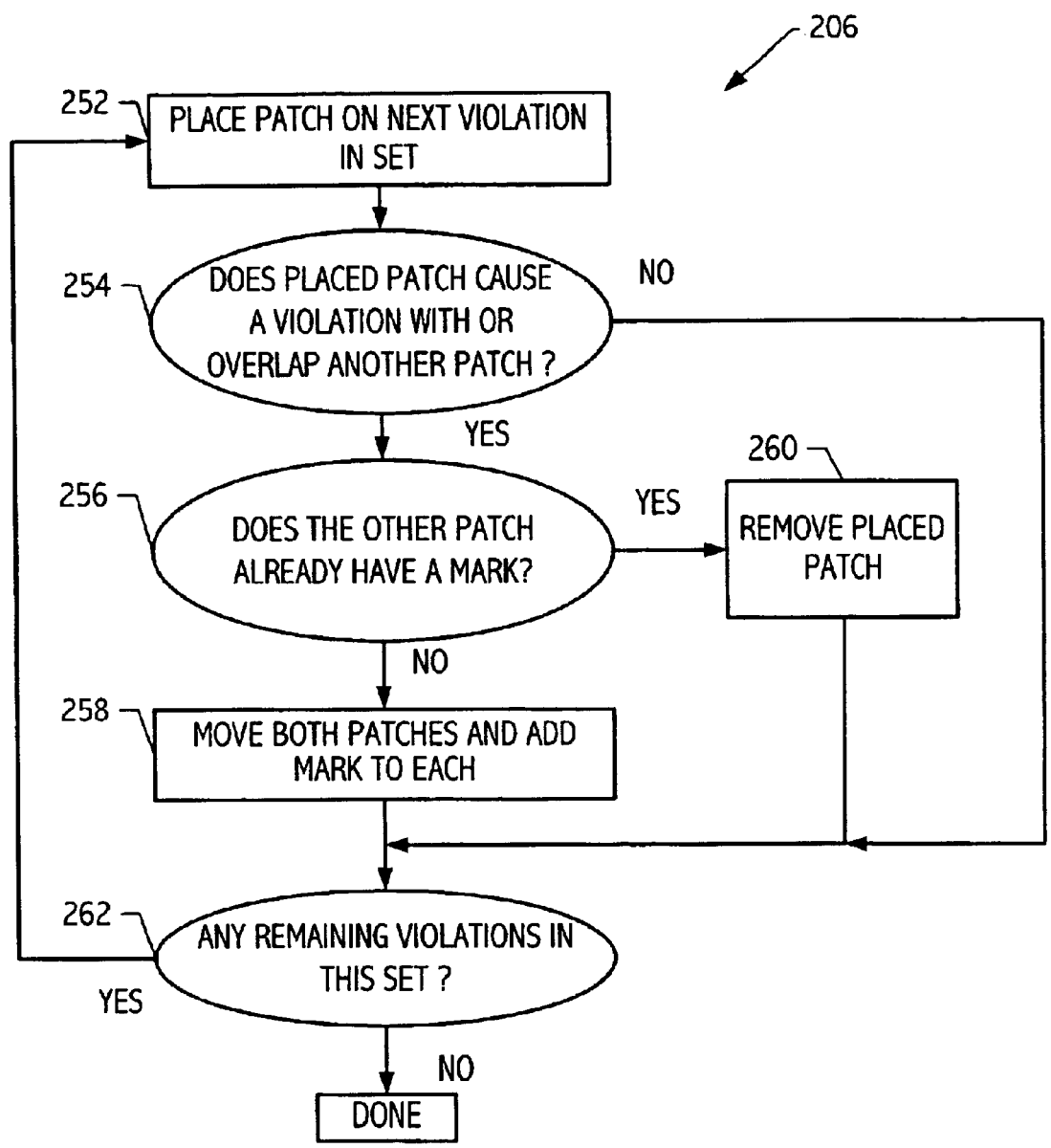
Figure 3A:
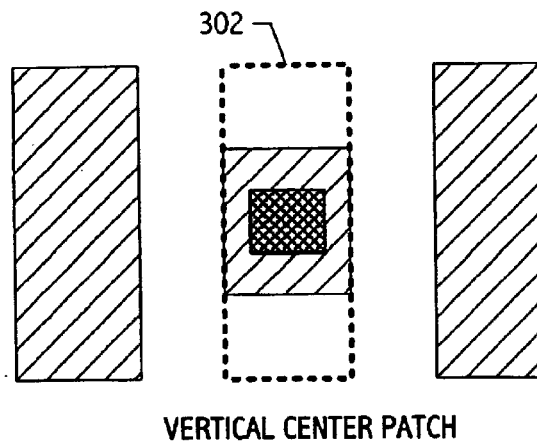
Figure 3B:
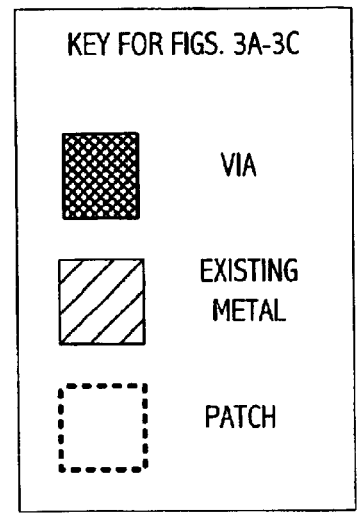
Figure 3B:
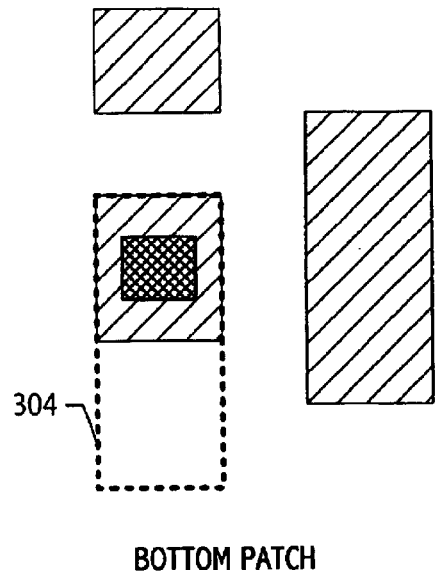
Figure 3C:
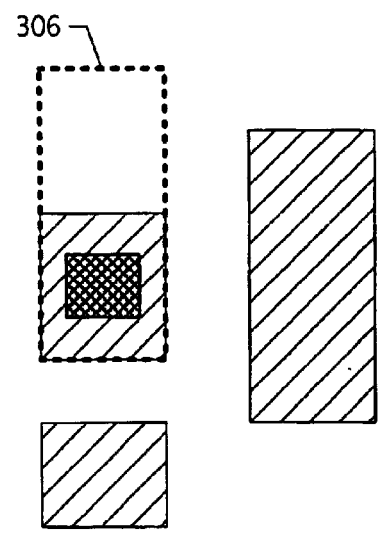

Next, minimum area violations are identified, step 204. Typically, DIVA is invoked to perform a design rule check and minimum area violations are flagged on a particular metal layer. Patches of a first predefined orientation are created and placed on a construction layer over the minimum area violations, step 206. This step is typically performed using SKILL. A construction layer is a temporary layer used in the patching process. The width of a patch is typically the via width plus the minimum metal enclosure, i.e., the length of the edge which is perpendicular to the routing channel. The length of the patch is the edge length which is in the routing direction, is typically greater than the width, and is at least the minimum area divided by the width (typically rounded up to the next grid line). Patches are placed to avoid minimum spacing violations with other placed patches. FIG. 2B illustrates an exemplary flow of the placement of patches to avoid minimum spacing violations with other placed patches according to an embodiment of the present invention.

DIVA is again invoked to perform a design rule check, checking the placed patches for design rule violations, for example, spacing rules between patches and existing metal, step 208. The design rule check can be optimized to check only existing metal spacing close to the patches, reducing run-time. All patches without violations are copied to the metal layer, step 210. All patches are removed from the construction layer, step 212. A design rule check is performed and a determination is made whether there are any remaining minimum area violations, step 214. If not, the flow is complete. Otherwise, a determination is made whether all predefined patch orientations have been attempted, step 216. If so, the flow is complete. Otherwise, the flow returns to creating and placing patches on a construction layer over the remaining minimum area violations utilizing the next predefined patch orientation, step 206. Steps 206–216 are repeated until all minimum area violations have been corrected or all predefined orientations have been attempted.

The design rule check can be performed by any suitable technique. However, in some embodiments, a design rule check is performed such that only metal pieces close to the patches within the range of widest metal spacing are checked to speed up the process. In a three wide metal class technology, using metal layer 1 as an example, the spacing rule to be used is spacing for $w_3$ class. One technique to separate wide metal classes is described in patent application Ser. No. 10/260,813, entitled "Structure and Method for Separating Geometries in a Design Layout into Multi-Wide Object Classes" by Mu-Jing Li and Amy Yang which application is hereby incorporated by reference. The design rule check flow preferably utilizes "Object To Check Pool" (OTCP) techniques described in patent application Ser. No. 10/121,322, entitled "Method to Simplify and Speed Up Design Rule/Electrical Rule Checks" by Mu-Jing Li and Amy Yang which application is hereby incorporated by reference to phase out patches which are violating the design rules.

In one embodiment, a design rule check assumes that all minimum area violation metal pieces are isolated and belong to $w_0$ class objects which do not contain any $w_i(i=1, 2, \ldots n)$ objects. Additionally, a minimum area violation metal piece does not necessarily have to be of a rectangular shape or completely covered by a patch. Further, all patches are assumed to belong to $w_0$ class objects which do not contain any $w_i(i=1, 2, \ldots n)$ objects. Also, every patch only overlaps with one minimum area violation metal piece. Otherwise, a potential ERC short circuit violation can be introduced.

Based on the above assumptions, the $w_0$ spacing check is implemented by first obtaining $w_0$ metal pieces which are close to the patches within the range of the largest spacing rule. Next, all patches are put into OTCP. Next, $w_0$ spacing violations among patches in OTCP are checked and those patches which are violating $w_0$ spacing rule are phased out (removed) from OTCP. Those which are still in OTCP are good patch candidates. Those patches which are overlapping or abutting more than one minimum metal area violation metal piece are phased out from OTCP to avoid possible ERC violations.

To check for any $w_0$ spacing violations between non-minimum area metal pieces and patches in OTCP, first, the minimum area violation metal pieces are deducted from the $w_0$ metal pieces, next, the left over $w_0$ metal pieces are enlarged by the amount of $w_0$ spacing, and finally, those patches which are overlapping the enlarged non-minimum $w_0$ metal pieces are phased out from OTCP. This algorithm utilizes patches on a construction layer rather than on the metal layer and the check is performed among the unrelated objects because minimum area violations are isolated metal objects, thus avoiding having to perform a time consuming corner to corner check.

For irregularly shaped minimum area violation metal pieces, the design rule check flow first deducts all the patches left over in OTCP from all the minimum area violation metal pieces. Because most of the violation metal pieces are covered completely by patches, the resultant pieces must be part of irregularly shaped minimum area violation pieces. Through the resultant small piece, the original irregular shaped minimum area violation metal pieces can be found. All patches which are in OTCP but not touching any irregularly shaped minimum area violation metal pieces are found and identified as normal patches. Finally, the irregularly shaped minimum area violation metal pieces are enlarged by the amount of $w_0$ spacing. Those normal patches which are overlapping with the enlarged metal pieces are phased out of the OTCP, leaving all patches with good $w_0$ spacing in OTCP. Implementing other $w_i(i=1, 2, \ldots n)$ class spacing check utilizes the $w_0$ pieces close to patches as the starting point to find all class objects, for example, $w_1$, $w_2$, and $w_3$. For each class, the objects are sized up by the amount of the corresponding spacing rule. Those patches which are overlapping the enlarged objects are phased out of the OTCP. This method also utilizes patches on a construction layer rather than the metal layer and performs the check among the unrelated objects, thus avoiding having to perform a time consuming corner to corner check.

Flow 200 can be performed on a portion of a design layout, a single metal layer or repeated for multiple metal layers. Flow 200 can be performed throughout the design process and repeated as design changes occur. Flow 200 automates the correction of minimum area violations utilizing predefined patch orientations and a regimented method of eliminating violations. Any minimum area violations not corrected by flow 200 can be fixed manually. Flow 200 greatly reduces the number of violations that need to be fixed manually, saving design time.

Figure 4A:
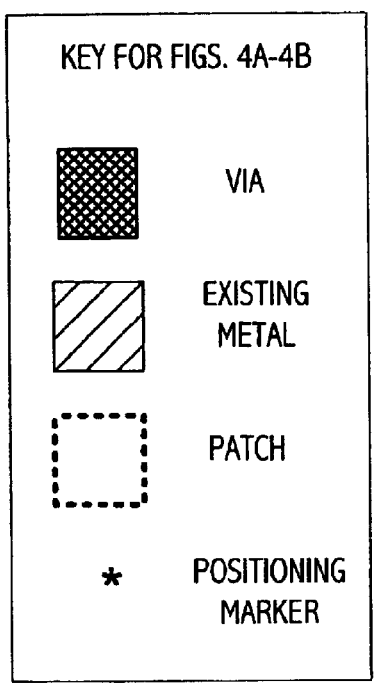
FIGS. 4A–4B illustrate an exemplary patching technique for minimum area violation correction according to an embodiment of the present invention.
Figure 4A:
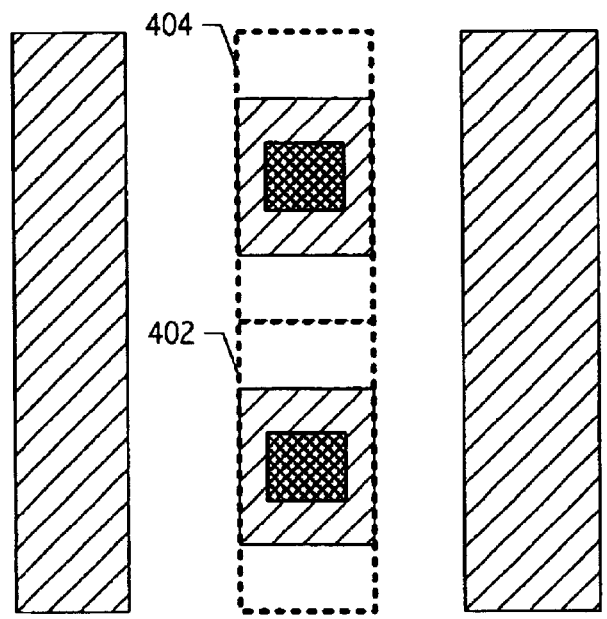
Figure 4B:
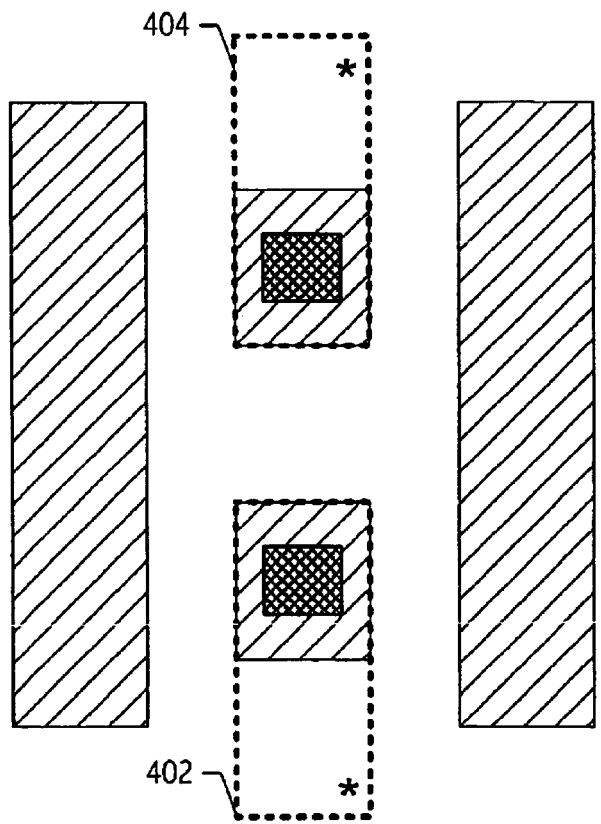

FIG. 2B illustrates an exemplary flow 206 of the placement of patches on a construction layer to avoid minimum spacing violations with other placed patches according to an embodiment of the present invention. Flow 206 is performed in SKILL which provides for the individual manipulation of patches. A patch is placed over a minimum area violation, step 252. A determination is made whether the placed patch causes a spacing violation with or overlaps a previously placed patch, step 254. FIG. 4A illustrates an example of a placed patch which violates minimum spacing rules with an already placed patch. If the placed patch causes a spacing violation with or overlaps another patch, a determination is made whether the other patch already has a positioning mark, step 256. If not, both patches are moved in opposite directions and marked to indicate modified positioning, step 258. For example, if the placed patch is in the center_v phase, the existing patch is moved from center to top or bottom and the newly placed patch is moved from center to bottom or top, respectively. FIG. 4B illustrates the movement of both patches 402 and 404 and the marking to indicate modified positioning according to an embodiment of the present invention. The positioning mark is a property added by SKILL to the patch object. If the existing patch has a positioning mark indicating that modified positioning has already occurred with respect to another patch, the new patch is removed, step 260. After steps 258 or 260 or if the placed patch does not cause a spacing violation with or overlap another patch, a determination is made whether any minimum area violations remain that have not had the current patch orientation placed, step 262. If not, the patching process is complete. Otherwise, a patch is placed on the next violation, step 252.

Jog Rule Violation Correction Patching

To correct jog rule violations with metal patches, a similar flow to the minimum area violation correction flow is utilized. However, first any concave jog rule violations are identified and individual patching is attempted. Next, convex violations related to contacts and different via types are divided into sets of violations that are patched differently based on the characteristics of each violation. For example, convex jog rule violations related to contacts can be corrected first using smaller patch sizes than convex jog rule violations related to vias. Lower and upper vias on a metal layer can be in different sets and corrected separately due to different widths and therefore different patch sizes.

An automated flow attempts to place patches according to a series of predefined orientations over each set. Most convex jog rule violations occur in groups near vias or contacts. Up to four convex jog rule violations can be related to a single via or contact and can typically be corrected using a single patch. The predefined orientations can follow, for example, the routing direction of the metal layer. Any remaining jog rule violations are attempted to be patched individually, patching concave jog rule violations and then convex jog rule violations.

The jog rule patch flow attempts to correct as many violations as possible in a short period of time while minimizing database size by using smallest patch sizes to correct multiple violations and while providing high patch quality having few zigzag edge segments. By organizing jog rule violations into different sets, the flow can correct each set in the most efficient way. For example, metal layers can have different design rules and wire widths and therefore can have different patch sizes. Additionally, each metal layer can have different types of vias with different metal enclosures, for example, upper and lower vias, that can have different patch sizes. Also, a convex jog can occur near a concave jog. If the concave jog is corrected, often the abutting convex jog is also corrected.

Figure 5A:
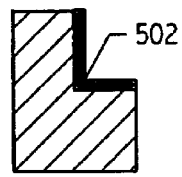
FIGS. 5A–5D illustrate exemplary jog rule violations corrected utilizing an embodiment of the present invention.
Figure 5B:
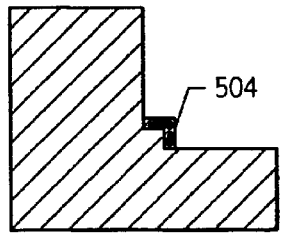
Figure 5C:
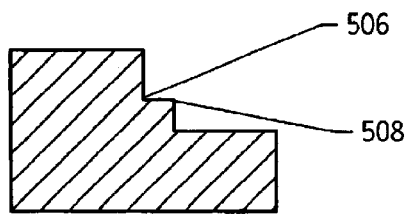
Figure 5D:
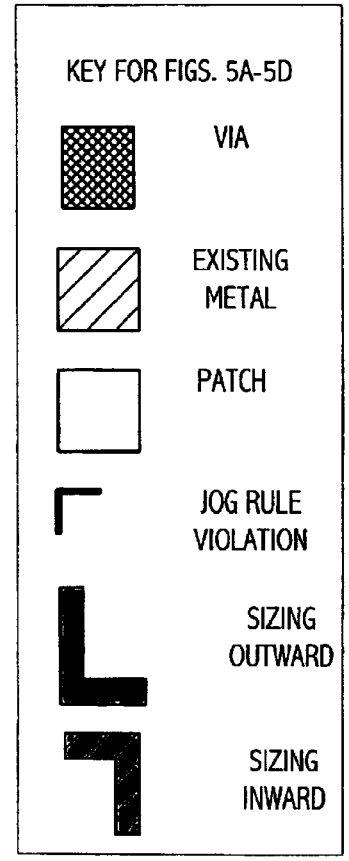
Figure 5D:
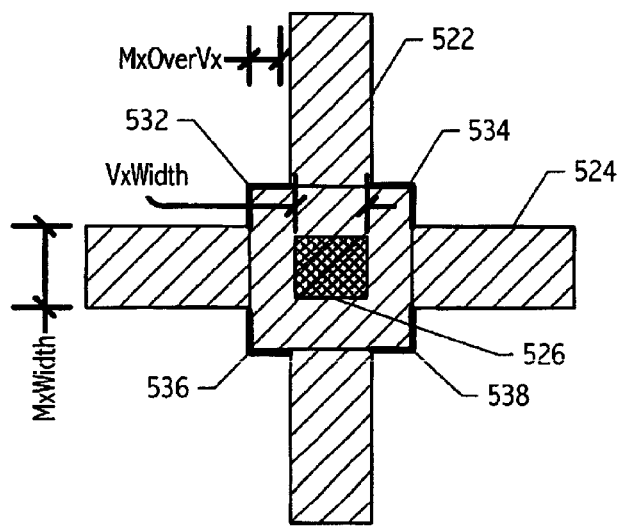

FIG. 5A illustrates an exemplary concave jog rule violation 502. FIG. 5B illustrates an exemplary convex jog rule violation 504. FIG. 5C illustrates an exemplary concave jog rule violation 506 abutting a convex jog rule violation 508. Convex jog rule violation 508 is typically corrected when patching concave jog rule violation 506. FIG. 5D illustrates a group of four convex jog rule violations 532, 534, 536, 538 related to a via 526.

According to one embodiment of the present invention, an algorithm to find jog rule violations can be used to create a flag and/or a correction marker on a construction layer, making the manipulation of the design utilizing CAD tools easier. As illustrated in FIG. 5A, edge segments of concave jog rule violation 502 are sized outward by a minimal amount, for example, by one tenth of a grid, forming a polygon geometry (i.e., not a rectangle). If two rectangles are formed, the edge segments do not form a concave jog rule violation. As illustrated in FIG. 5B, edge segments of convex jog rule violation 504 are sized inward by a minimal amount forming a polygon geometry (i.e., not a rectangle). If two rectangles are formed, the edge segments do not form a convex jog rule violation. The polygon geometries are derived to flag jog rule violations and can be used as anchors for patch placement.

FIG. 5D illustrates a common configuration of four convex jog rule violations related to a via. As illustrated, two wires 522 and 524 cross perpendicularly and a via 526 is located at the center of the cross area. Because the via width (VxWidth plus 2 times MxOverVx) is greater than the wire width (MxWidth), four convex jog rule violations 532, 534, 536 and 538 occur. Jog rule violations also can also occur where a via is located on a contact cell because vias and contacts have different widths. MxOverVx is the required enclosure metal width surrounding a via.

Figure 6A:
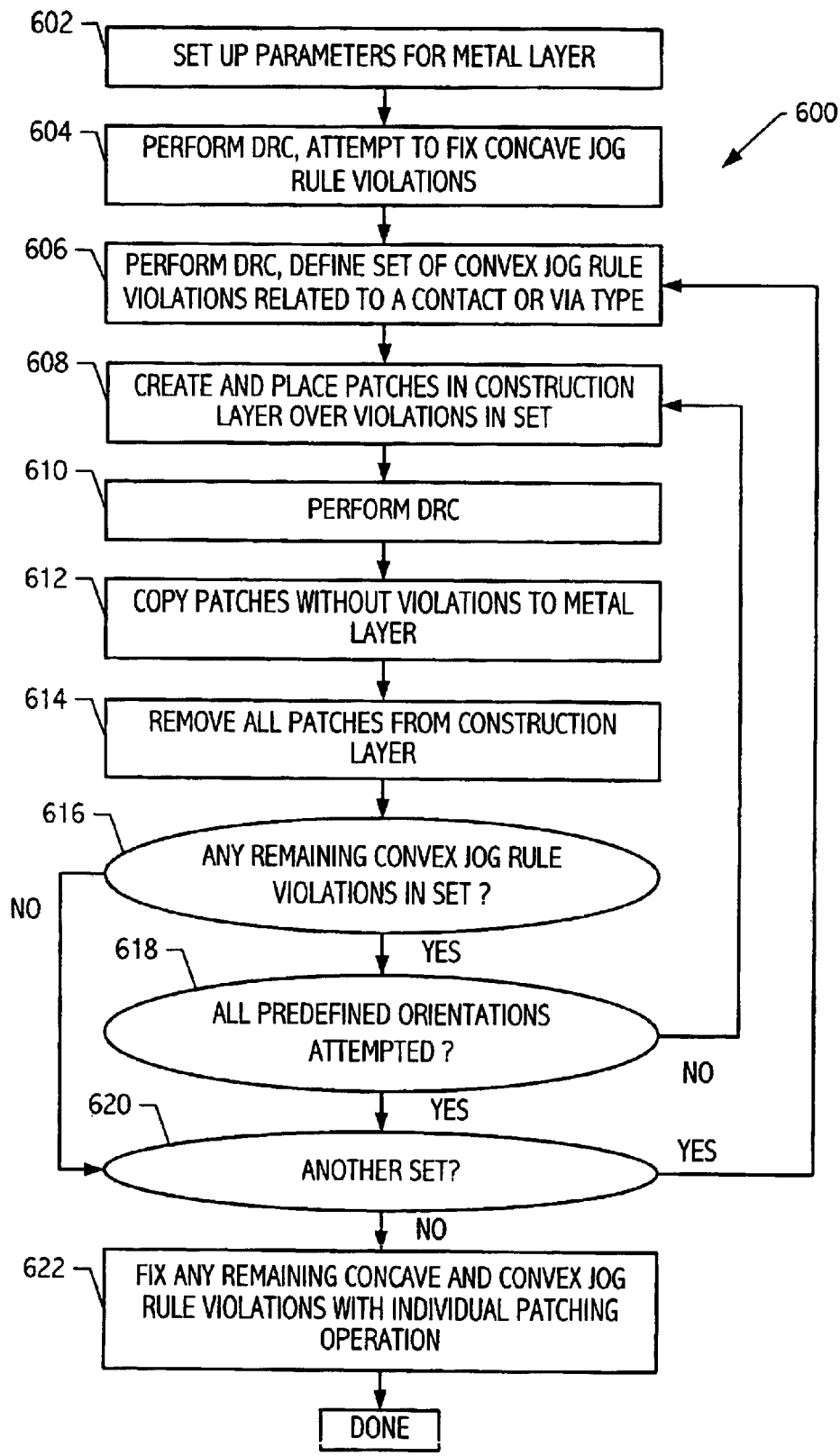
FIGS. 6A–6B illustrate exemplary automated flows for jog rule violation correction patching according to an embodiment of the present invention.

FIG. 6 illustrates an exemplary automated flow for jog rule violation correction patching according to an embodiment of the present invention. Flow 600 attempts to correct concave jog rule violations with individual patch, then convex jog rule violations related to vias and contacts using a series of predefined patch orientations and then individually patches any remaining concave and convex jog rule violations with individual patching. Flow 600 only extends one of the two edge segments causing the jog rule violation. Thus, when one of the segments is greater than the JogLength, the jog rule violation is fixed. To make the fix as smooth as possible, the patch is not cut, but is moved around to find the best result. By doing this, the overall number of patches can be reduced to avoid significantly inflating the design database. Flow 600 can be implemented in SKILL programming language or other programming language understood by CAD tools for the manipulation of design layouts. Flow 600 invokes DIVA to perform design rule checking on a metal layer.

Parameters for a given metal layer are configured and initialized, step 602. For example, a SKILL program can open the design cell view, identify a metal layer to be processed, and set the default routing directions (horizontal or vertical). Also, predefined patch orientations for each routing direction can be configured. FIGS. 7A–7F illustrate a series of exemplary patch orientations for patching convex jog rule violations related to vias or contacts according to an embodiment of the present invention. Note that both the metal layer with, for example, existing metal geometries, wires, and vias, and a construction layer with patches are illustrated. FIGS. 7A–7F illustrate, respectively, a center patch for vertical routing 702 (center_v), a bottom patch 704 (bottom), a top patch 706 (top), a center patch for horizontal routing 708 (center_h), a right patch 710 (right), and a left patch 712 (left). Exemplary predefined orientations for horizontal routing indicating the order in which patch orientations are attempted are center_h, left, right, center_v, top, bottom. Exemplary predefined orientations for vertical routing are center v, top, bottom, center_h, left, right. Orientations for patch placement over convex jog rule violations related to vias or contacts are typically attempted in this order because the via or contact is typically on a wire and extra area is often available in the routing direction. Note that center_v patch 702 and center_h patch 708 can correct up to four convex jog rule violations while the others can only correct up to two.

FIGS. 7A–7F illustrate patching options for square vias. If a via is rectangular, only the portion of the via which is related to the jog rule violation is flagged. Using the via marker as an anchor, the flow patches around the via marker, using patches according to FIGS. 7A–7F.

Next, concave jog rule violations are identified, step 604. Typically, DIVA is invoked to perform a design rule check and concave jog rule violations are flagged. The concave jog rule violations are attempted to be corrected utilizing individual patching as described in relation to FIG. 8A.

Next, a set of convex jog rule violations related to a contact or a particular type of via are identified, utilizing a design rule check performed by DIVA, step 606. The jog rule violations can be identified in sets, for example, as convex jog rule violations related to a particular type of via on a particular metal layer, convex jog rule violations related to contacts, and the like.

Patches of a first predefined orientation are created and placed on a construction layer over the convex jog rule violations in the set, step 608. According to one embodiment of the present invention, convex jog rule violations are separated into sets according to, for example, metal layer and whether the violations are related to a particular via type or a contact. Thus, steps 608 through 618 can be repeated for each defined set. Patch sizes and predefined orientations can vary between sets. For example, metal layers have different metal widths and thus associated patches have different widths. Optimally, sets of violations are patched in the order of smallest patch size to largest, considering that some violations can be corrected when correcting others.

Using the related via or contact as an anchor, patches are placed. A patch has a width at least equal to (VxWidth+2*MxOverVx). The length of the patch is at least (VxWidth+2*(MxOverVx+JogLength)).

Figure 6B:
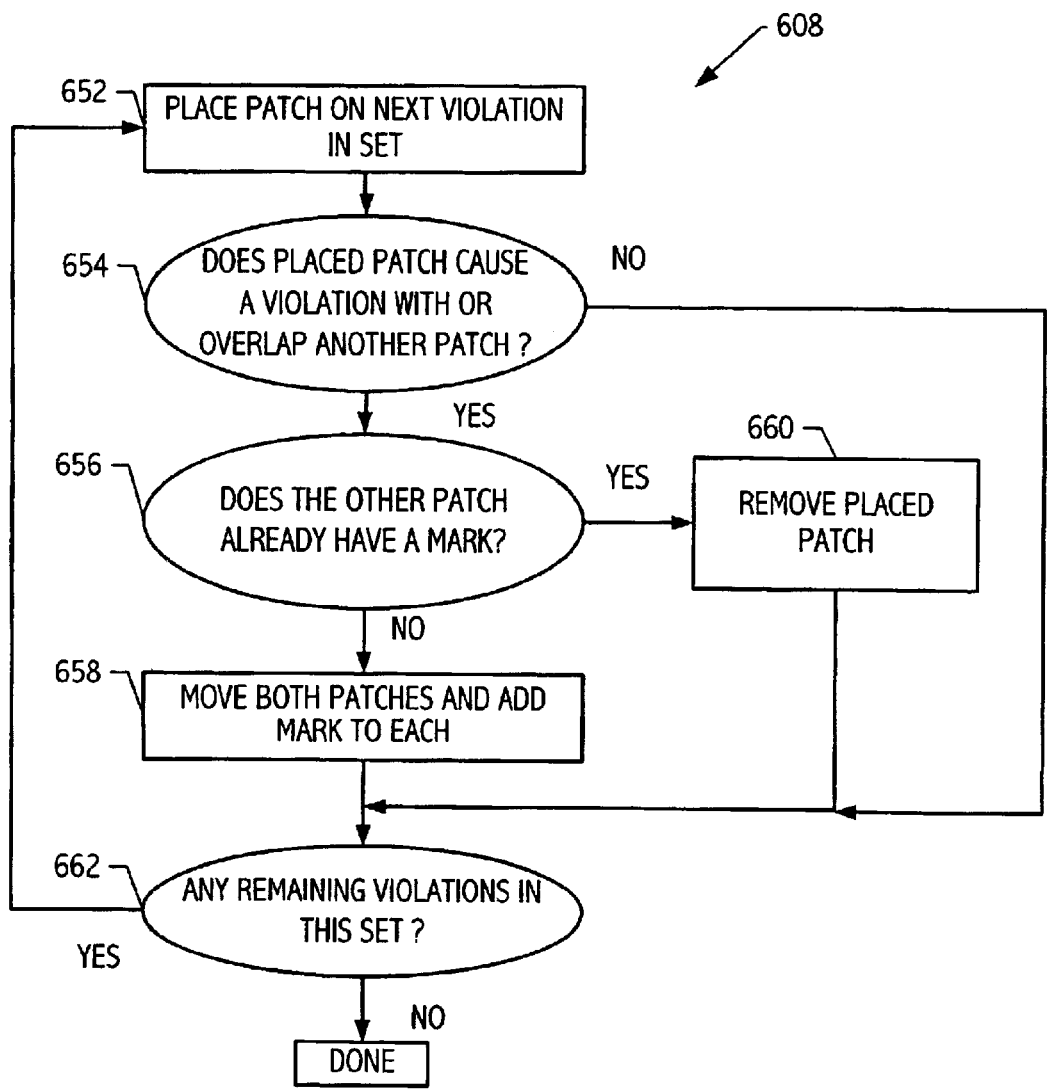

Patches are placed to avoid minimum spacing violations with other placed patches. FIG. 6B illustrates an exemplary flow of the placement of patches over convex jog rule violations to avoid minimum spacing violations with other placed patches according to an embodiment of the present invention.

DIVA is again invoked to perform a design rule check, checking the placed patches for design rule violations, for example, spacing violations with respect to existing metal, step 610. The design rule check can be optimized to check only existing metal spacing close to the patches, reducing run-time. All patches without violations are copied to the metal layer, step 612. All patches are removed from the construction layer, step 614. A design rule check is performed and a determination is made whether there are any remaining convex jog rule violations in the current set, step 616. If so, a determination is made whether all predefined patch orientations have been attempted, step 618. If not, the flow returns to creating and placing patches on a construction layer over any remaining jog rule violations in the set utilizing the next predefined patch orientation, step 608. Steps 608–618 are repeated until all convex jog rule violations in the set have been corrected or all predefined orientations have been attempted. If there are no remaining convex jog rule violations in the set or all predefined orientations have been attempted, a determination is made whether there is another set of convex jog rule violations to be corrected, step 620. If so, the next set of convex jog rule violations is patched returning to step 606. If not, any remaining concave and convex jog rule violations are individually patched, step 622. Concave jog rule violations are typically patched first followed by patching the convex jog rule violations because correcting concave jog rule violations can correct some abutting convex jog rule violations.

In some embodiments, the design rule check can be performed such that only metal close to the patches within the range of widest metal spacing is checked to speed up the design rule check process. In a three wide metal class technology, using metal layer 1 as an example, the spacing rule to be used is spacing for $w_3$ class. Because the violation metal shapes usually are not isolated, the patches are checked with the related metal together which increases the complexity of the DRC and ERC. The design rule check flow preferably utilizes "Object To Check Pool" (OTCP) techniques described in the above referenced patent application Ser. No. 10/121,322 to phase out patches which are violating the design rules.

The OTCP technique is based on the assumption that the original design is free of DRC and ERC violations. An exemplary flow is described as follows: First, all $w_0$ geometries which are close to the patches and less than the largest spacing rule are obtained by sizing patches up by $w_3$ spacing amount. For a $w_0$ spacing check, all patches in OTCP are merged with the found related $w_0$ geometry areas. Next, the $w_0$ spacing and notch violations among those merged $w_0$ shapes are checked. Because the original design was DRC clean, any violations must be related to a patch. Patches which are involved in the violation are phased out. The merged $w_0$ is reset by merging the original $w_0$ with those patches still in OTCP. A $w_0$ corner to corner spacing check is performed on the newly merged $w_0$ shapes. All patches which are overlapping with any convex corner checking box are phased out of OTCP. Next, all the $w_i$ class shapes based on the $w_0$ generated at the first step are obtained. For each $w_i$ (i=1, 2, ... n) class, the patches still in OTCP are merged with the $w_0$ geometries, and $w_i$ to merged $w_0$ spacing check is performed, all the patches which are involved in a spacing violation are phased out of OTCP. Convex corner check boxes only on $w_i$ objects are created, and all the patches which are overlapping with the check boxes are phased out of OTCP. In addition, if a patch makes a $w_i$ object into a $w_{i+1}$ object and causes a spacing violation, the patch is also phased out. The flow derives the patches in OTCP as the existing metal to correct part of the violations in the current patching direction and outputs the proper jog markers ready for next patching direction, or performs special processing if it has gone through all the patching options. The above exemplary DRC algorithm loops through all the metal-via and patching direction combinations.

Flow 600 can be performed on a portion of a design layout, a single metal layer or repeated for multiple metal layers. Flow 600 can be performed throughout the design process and repeated as design changes occur. Flow 600 automates the correction of jog rule violations utilizing predefined patch orientations and a regimented method of eliminating violations. Any jog rule violations not corrected by flow 600 can be fixed manually. Flow 600 greatly reduces the number of violations that need to be fixed manually, saving design time.

FIG. 6B illustrates an exemplary flow of the placement of patches on a construction layer to avoid minimum spacing violations with other placed patches according to an embodiment of the present invention. Flow 608 is performed in SKILL which provides for the individual manipulation of patches. A patch is placed over a group of convex jog rule violations related to, for example, a particular contact or via, step 652. A determination is made whether the placed patch causes a spacing violation with or overlaps another patch, step 654. If the placed patch causes a spacing violation with or overlaps another patch, a determination is made whether the other patch already has a positioning mark, step 656. The positioning mark is a property added by SKILL to the patch object. If not, both patches are moved in opposite directions and marked to indicate modified positioning, step 658. For example, if the placed patch is in the center_v phase, the existing patch is moved from center to top or bottom and the newly placed patch is moved from center to bottom or top, respectively. If the existing patch has a positioning mark indicating that modified positioning has already occurred with respect to another patch, the new patch is removed, step 660. After steps 658 or 660 or if the placed patch does not cause a spacing violation with or overlap another patch, a determination is made whether any convex jog rule violations remain that have not had the current patch orientation placed, step 662. If not, the flow is complete. Otherwise, a patch is placed on another group of violations related to, for example, another contact or via, step 652.

Figure 8A:
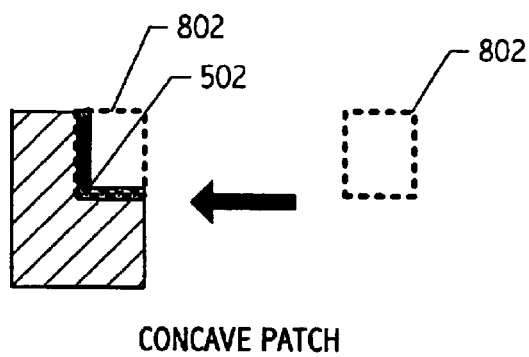
FIGS. 8A–8B illustrate exemplary concave and convex patch sizings according to an embodiment of the present invention.
Figure 8B:
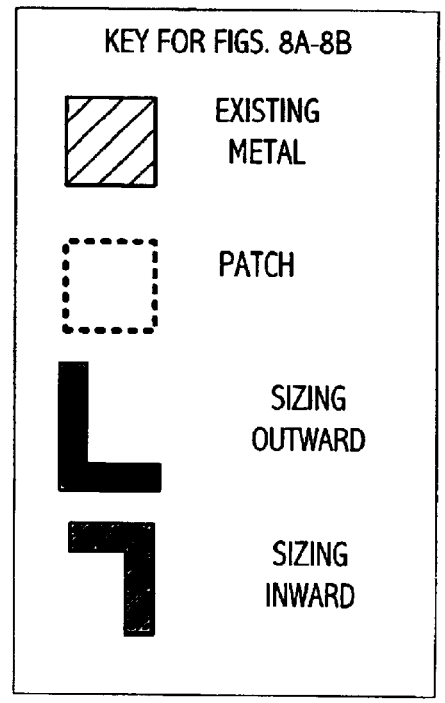
Figure 8B:
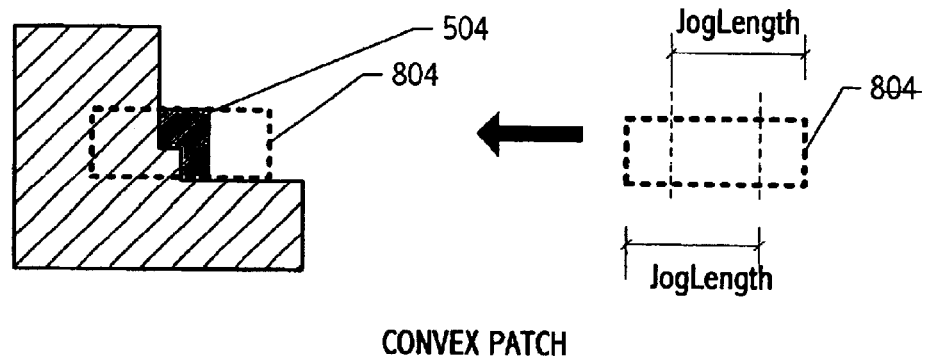

Referring to FIG. 8A, an individual concave patch 802 is created by utilizing the bounding box of the polygon geometry created by the sizing outward operation. Referring to FIG. 8B, an individual convex patch 804 is created by extending, in the horizontal routing direction for a metal layer with a horizontal routing direction, the edges of the bounding box of the polygon geometry created by the sizing inward operation such that when measured from the bounding box left to the right edge of the patch or from the bounding box right to the left edge of the patch, both measurements equal JogLength. Note that for a metal layer with vertical routing direction, the edges of the bounding box are extended in the vertical direction. The length of patch 804 is the length of the bounding box. Although one side is inside the metal, the other side extends the edge to the JogLength, correcting the jog rule violation. The convex patching operation could potentially generate new jog rule violations, thus is used as a final effort to correct jog rule violations.

Flow 600 is typically repeated for each metal layer/via or metal layer/contact pair combination. The flow loops through all metal-via/contact combinations. If a metal layer has different via width and/or metal enclosure for the lower and upper vias, the metal layer is processed twice. For example, metal layer 1 has contact and via1 which have different widths and thus processed twice, once with respect to the contact and second with respect to the via. Flow 600 can be performed on a portion of a design layout, a single metal layer or repeated for multiple metal layers. Flow 600 can be performed throughout the design process and repeated as design changes occur. Flow 600 automates the correction of jog rule violations utilizing predefined patch orientations and a regimented method of eliminating violations.

Any remaining jog rule violations are left for manual correction and are most likely the result of insufficient area for a patch causing spacing design rule violations close to the jog rule violation. Flow 600 greatly reduces the number of violations that need to be fixed manually, saving design time.

Unfixed via jogs from one set can be fixed when processing another set. For example, two types of jogs can be created when lower via jogs overlap with upper via jogs.

Flows 200 and 600 are utilized for correction of minimum area and jog rule violations according to some embodiments of the invention. It is appreciated that operations discussed herein may include directly entered commands by a computer system user, but some embodiments can include steps executed by software modules. The functionality of steps referred to herein may correspond to the functionality of modules or portions of modules. In addition to software modules, the above flows or portions of flows can be implemented as application instructions or menu items.

The operations referred to herein may be modules or portions of modules (e.g., software, firmware, or hardware modules). For example, the software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in exemplary embodiments are for illustration only. Operations may be combined or the functionality of the operations may be distributed in additional operations in accordance with the invention.

Thus, the flows described herein, the operations thereof and modules therefore may be executed on a computer system configured to execute the operations of the flows and/or may be executed from computer-readable media. The flows may be embodied in a machine-readable and/or computer-readable medium for configuring a computer system to execute the flows. Thus, the software modules may be stored within and/or transmitted to a computer system memory to configure the computer system to perform the functions of the module.

The flows described herein can be applied to an entire design layout or portions thereof. For example, applying a flow to a smaller portion of a design layout can be performed to improve EDA tool performance, or as portions of the design layout are completed, or when only a portion of the design layout needs an increased density, or any other similar reason.

Although the above embodiments have been described in relation to Cadence EDA tools and SKILL language code, the techniques described herein can be applicable to and make use of any EDA tools, electronic circuit layout, and implemented in any code language.

Although the above embodiments have been described in relation to integrated circuit layouts, the techniques described herein can be equally useful in the layout of other electronic devices, for example in a layout of a printed wiring board.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method comprising:
    identifying a plurality of violations;
    attempting to correct the plurality of violations by placing a patch of a predefined orientation over at least one of the plurality of violations; and
    repeating the attempting to correct the plurality of violations by placing another patch of another predefined orientation over at least one of the plurality of violations not corrected by the patch of the predefined orientation.

2. The method, as recited in claim 1, wherein a series of predefined patch orientations are attempted until all of the plurality of violations are corrected or until all of the series of predefined patches have been attempted.

3. The method, as recited in claim 1, wherein the attempting to correct the plurality of violations comprises:
    determining if an added patch overlaps or causes a spacing violation with a previously added patch;
    if so and the previously added patch has a marking indicating modified placement, removing the added patch, and
    if so and the previously added patch does not have the marking, moving the added patch and the previously added patch in opposite directions and adding the marking to each of the added patch and the previously added patch.

4. The method, as recited in claim 1, wherein the plurality of violations consists of minimum area violations.

5. The method, as recited in claim 1, wherein the plurality of violations consists of convex jog rule violations related to lower vias.

6. The method, as recited in claim 5, wherein a width of the patches is a width of the lower vias plus two times a metal enclosure width and a length of the patches is two times a minimum jog length plus the width of the lower vias plus two times the metal enclosure width.

7. The method, as recited in claim 1, wherein the plurality of violations consists of convex jog rule violations related to upper vias.

8. The method, as recited in claim 1, wherein the plurality of violations consists of convex jog rule violations related to contacts.

9. The method, as recited in claim 1, wherein the predefined orientation is defined according to a routing direction.

10. The method, as recited in claim 1, further comprising first attempting to correct a plurality of concave jog rule violations by placing an individual patch over each of the plurality of concave jog rule violations.

11. A method for creation of a design layout of an electronic circuit, the method comprising:
    identifying a set of violations on a layer;
    adding patches of a predefined orientation on another layer over the set of violations;
    copying each patch that does not cause a design rule violation to the layer;
    removing all patches from the another layer; and
    repeating the adding, the copying and the removing to remaining violations in the set of violations using patches of another predefined orientation.

12. The method, as recited in claim 11, wherein the adding the patches comprises:
    determining if an added patch overlays or causes a spacing violation with a previously added patch;
    if so and the previously added patch has a marking indicating modified placement, removing the added patch; and
    if so and the previously added patch does not have the marking, moving the added patch and the previously added patch in opposite directions and adding the marking to each of the added patch and the previously added patch.

13. The method, as recited in claim 11, wherein the set of violations consists of minimum area violations.

14. The method, as recited in claim 11, wherein the set of violations consists of convex jog rule violations related to lower vias on the layer.

15. The method, as recited in claim 14, wherein a width of the patches is a width of the lower vias plus two times a metal enclosure width and a length of the patches is two times a minimum jog length plus the width of the lower vias plus two times the metal enclosure width.

16. The method, as recited in claim 11, wherein the set of violations consists of convex jog rule violations related to upper vias on the layer.

17. The method, as recited in claim 11, wherein the set of violations consists of convex jog rule violations related to contacts on the layer.

18. The method, as recited in claim 11, wherein the copying each patch corrects more than one of the violations in the set of violations.

19. The method, as recited in claim 11, further comprising:
    adding individual patches to concave jog rule violations.

20. The method, as recited in claim 11, wherein the predefined orientation is defined according to a routing direction of the layer.

21. The method, as recited in claim 11, wherein the layer is a metal layer and the another layer is a construction layer.

22. The method, as recited in claim 11, further comprising first attempting to correct a plurality of concave jog rule violations by placing an individual patch over each of the plurality of concave jog rule violations.

23. A method of processing one or more design files for an electronic circuit, the one or more design files encoding representations of a design layout of the electronic circuit, the method comprising:
    identifying a set of violations on a layer;
    adding patches of a predefined orientation to another layer over the set of violations;
    copying each patch that does not cause a design rule violation to the layer;
    removing all patches from the another layer; and
    repeating the adding, the copying and the removing to remaining violations in the set of violations using patches of another predefined orientation.

24. The method, as recited in claim 23, wherein the adding the patches comprises:
    determining if an added patch overlays or causes a spacing violation with a previously added patch;
    if so and the previously added patch has a marking indicating modified placement, removing the added patch; and
    if so and the previously added patch does not have the marking, moving the added patch and the previously added patch in opposite directions and adding the marking to each of the added patch and the previously added patch.

25. The method, as recited in claim 23, wherein the set of violations consists of minimum area violations.

26. The method, as recited in claim 23, wherein the set of violations consists of convex jog rule violations related to lower vias on the layer.

27. The method, as recited in claim 23, wherein the copying each patch corrects more than one of the violations in the set of violations.

28. The method, as recited in claim 23, further comprising:
    adding individual patches to concave jog rule violations.

29. The method, as recited in claim 23, the predefined orientation is defined according to a routing direction of the layer.

30. The method, as recited in claim 23, wherein the layer is a metal layer and the another layer is a construction layer.

31. A computer readable encoding of an electronic circuit design, the computer readable encoding comprising:
    one or more design file media encoding representations of one or more design geometries; and
    one or more design file media encoding representations of vias;
    wherein the computer readable encoding of the electronic circuit design was generated by:
    identifying a plurality of violations;
    attempting to correct the plurality of violations by placing a patch of a predefined orientation over at least one of the plurality of violations; and
    repeating the attempting to correct the plurality of violations by placing another patch of another predefined orientation over at least one of the plurality of violations not corrected by the patch of the predefined orientation.

32. The computer readable encoding, as recited in claim 31, wherein a series of predefined patch orientations are attempted until all of the plurality of violations are corrected or until all of the series of predefined patches have been attempted.

33. The computer readable encoding, as recited in claim 31, wherein attempting to correct the plurality of violations comprises:
    determining if an added patch overlaps or causes a spacing violation with a previously added patch;

if so and the previously added patch has a marking indicating modified placement, removing the added patch; and if so and the previously added patch does not have the marking, moving the added patch and the previously added patch in opposite directions and adding the marking to each of the added patch and the previously added patch.

34. The computer readable encoding, as recited in claim 31, wherein the plurality of violations consists of minimum area violations.

35. The computer readable encoding, as recited in claim 31, wherein the plurality of violations consists of convex jog rule violations related to vias on a metal layer.

36. The computer readable encoding, as recited in claim 31, the predefined orientation is defined according to a routing direction of a metal layer.

37. The computer readable encoding, as recited in claim 31, wherein the computer readable encoding of the electronic circuit design was further generated by first attempting to correct a plurality of concave jog rule violations by placing an individual patch over each of the plurality of concave jog rule violations.

38. An apparatus comprising:

means for processing one or more design files for an electronic circuit, the one or more design files encoding representations of a design layout of the electronic circuit, the means for processing comprising:
means for identifying a set of violations on a layer;
means for adding patches of a predefined orientation on another layer over the set of violations;
means for copying each patch that does not cause a design rule violation to the layer;
means for removing all patches from the another layer; and
means for repeating the means for adding, the means for copying and the means for removing to remaining violations in the set of violations using patches of another predefined orientation.

39. The apparatus, as recited in claim 38, wherein the means for adding the patches comprises:

means for determining if an added patch overlaps or causes a spacing violation with a previously added patch;
means for removing the added patch if the added patch causes a spacing violation and the previously added patch has a marking indicating modified placement; and
means for moving the added patch and the previously added patch in opposite directions and means for adding the marking to each of the added patch and the previously added patch if the added patch causes a spacing violation and the previously added patch does not have the marking.

40. The apparatus, as recited in claim 38, wherein the set of violations consists of minimum area violations.

41. The apparatus, as recited in claim 38, wherein the set of violations consists of convex jog rule violations related to lower vias on the layer.

42. The apparatus, as recited in claim 41 wherein the means for copying each patch corrects more than one of the violations in the set of violations.

43. The apparatus, as recited in claim 41, further comprising:
means for adding individual patches to concave jog rule violations.

44. The apparatus, as recited in claim 38, the predefined orientation is defined according to a routing direction of the layer.

45. The apparatus, as recited in claim 38, wherein the layer is a metal layer and the another layer is a construction layer.

46. A method of making a computer readable media product that encodes a design file representation of an electronic circuit, the method comprising:
identifying a set of violations on a layer;
adding patches of a predefined orientation to another layer over the set of violations;
copying each patch that does not cause a design rule violation to the layer;
removing all patches from the another layer; and
repeating the adding, the copying and the removing to remaining violations in the set of violations using patches of another predefined orientation.

47. The method, as recited in claim 46, wherein the adding the patches comprises:
determining if an added patch overlaps or causes a spacing violation with a previously added patch;
if so and the previously added patch has a marking indicating modified placement, removing the added patch; and
if so and the previously added patch does not have the marking, moving the added patch and the previously added patch in opposite directions and adding the marking to each of the added patch and the previously added patch.

48. The method, as recited in claim 46, wherein the set of violations consists of minimum area violations.

49. The method, as recited in claim 46, wherein the set of violations consists of convex jog rule violations related to vias on the layer.

50. The method, as recited in claim 49, wherein the copying each patch corrects more than one of the violations in the set of violations.

51. The method, as recited in claim 46, further comprising:
adding individual patches to concave jog rule violations.

52. The method, as recited in claim 46, the predefined orientation is defined according to a routing direction of the layer.

53. The method, as recited in claim 46, wherein the computer readable media product is embodied as one or more media selected from the set of a disk, tape, or other magnetic, optical, semiconductor or electronic stage medium and a network, wire line, wireless or other communications medium.

* * * * *